(12) United States Patent
Sun et al.

(10) Patent No.: US 7,672,110 B2
(45) Date of Patent: Mar. 2, 2010

(54) ELECTROSTATIC CHUCK HAVING TEXTURED CONTACT SURFACE

(75) Inventors: Jennifer Y. Sun, Sunnyvale, CA (US); James Dempster, Reno, NV (US); Semyon L. Kats, San Francisco, CA (US); Allen Fox, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 625 days.

(21) Appl. No.: 11/214,286

(22) Filed: Aug. 29, 2005

(65) Prior Publication Data
US 2007/0047170 A1   Mar. 1, 2007

(51) Int. Cl.
*H01L 21/683* (2006.01)
*H01T 23/00* (2006.01)
*B23B 31/28* (2006.01)

(52) U.S. Cl. .................................. 361/234; 279/128
(58) Field of Classification Search ................ None
See application file for complete search history.

(56) References Cited

U.S. PATENT DOCUMENTS 7,068,489 B2 *   6/2006   Migita .................... 361/234
2005/0252454 A1 *  11/2005   Parkhe et al. ............... 118/729

* cited by examiner

*Primary Examiner*—Stephen W Jackson
*Assistant Examiner*—Dharti H Patel
(74) *Attorney, Agent, or Firm*—Janah & Associates, P.C.

(57) ABSTRACT

An electrostatic chuck has an electrode embedded in a dielectric which is mounted on a pedestal. The dielectric has a contact surface with an average surface roughness of less than about 0.5 μm, a surface peak waviness of less than about 0.12 μm, and a surface peak waviness material ratio of greater than about 20%. The surface texture can be formed by lapping the dielectric surface with a slurry of abrasive particles.

20 Claims, 3 Drawing Sheets

ELECTROSTATIC CHUCK HAVING TEXTURED CONTACT SURFACE

BACKGROUND

Embodiments of the present invention relate to an electrostatic chuck for holding a substrate in a process chamber.

In the processing of substrates, such as semiconducting wafers and displays, a substrate is placed on a substrate support in a process chamber and suitable processing conditions are maintained in the chamber, for example, to etch or deposit material on the substrate. The support can include an electrostatic chuck having at least one electrode that can be electrically charged to electrostatically hold the substrate on the support. The electrode can also be electrically biased, for example with a high frequency electrical power, such as RF (radio frequency) power to energize process gas provided in the chamber to process the substrate. The support typically includes a pedestal that supports the electrostatic chuck to provide better temperature control of the chuck and to allow raising and lowering of the height of the chuck in the chamber.

The temperature of each substrate has to be precisely controlled to ensure temperature uniformity across the substrate surface; otherwise, uneven etch and deposition rates are obtained across the substrate. It is also necessary to maintain uniform temperatures from one substrate to another in the processing of a batch of substrates. Substrate temperature control is achieved by controlling the thermal impedance properties of the contact surface between the chuck and the substrate. The temperature of the substrate can also be controlled by supplying a heat transfer gas, such as helium, to the backside of the substrate.

However, it is difficult to precisely control substrate when the surface texture of the contact surface of the chuck is uneven or has an uncontrolled surface roughness. The surface texture comprises peaks and valleys that vary in height and spacing depending on upon the way the surface was produced, for example, machine surfaces have peaks and valleys with uniform spacing and direction while ground surfaces have a more random spacing. The uneven surface texture of the contact surface can result in different thermal resistances across the backside of the substrate causing different temperatures across the substrate frontside. Also, an uneven contact surface can result in leakage of the heat transfer gas from selected regions at the interface of the substrate and the contact surface. Leaking of the heat transfer gas reduces the pressure of the heat transfer gas against the substrate backside causing loss of heat transfer efficiency and corresponding rises in temperature at those selected regions of the substrate.

Substrate surface temperature variations have been reduced by polishing the contact surface to, for example, have a predefined range of surface roughness average. The chuck surface can be polished by, for example, rotating a grinding pad against the surface until the surface has a defined surface roughness average. Controlled surface roughness reduces leakage of heat transfer gas because the relatively smooth surface is pressed substantially flush against the backside of the substrate to seal the heat transfer gas between the substrate and chuck. The surface roughness values can be measured using conventional profilometers.

However, even chucks having polished contact surfaces with low surface roughness values can give rise to unexplainable substrate temperature variations. Local surface non-uniformities also result in poor chucking because variations in surface texture affect the electrostatic chucking and the time required to de-chuck the substrate. The local surface variations and anomalies become particularly problematic in the processing of features having smaller and smaller dimensions, for example, interconnect lines having widths of less than 90 nm. Also, when processing a batch of substrates to etch such lines, it was found that the later substrates processed on the chuck surface were often found to have more variation in etching rates and different critical dimensions (CD) than earlier processed substrates. These chucks were simply removed from the chamber and scrapped because the cause of the change in processing characteristics was not known. The undesirable shift in etching rates and CD also makes it difficult to select proper process parameters to achieve consistent substrate processing results for a batch of substrates. Thus, conventional polished chuck surfaces having selected range of surface roughness average often failed to provide consistent processing results for a batch of substrates.

Thus, it is desirable to have a substrate support and electrostatic chuck having a contact surface that provides good substrate temperature control and consistent processing results for processing a batch of substrates. It is furthermore desirable to have a method of selecting or fabricating the substrate support, which allows better control of surface anomalies that result in inconsistent processing results. It is further desirable to be able to reuse a chuck, which has been used to process a number of substrates without scrapping the chuck.

SUMMARY

An embodiment of an electrostatic chuck for holding a substrate in a process chamber comprises a dielectric enclosing at least one electrode capable of receiving an electrical charge to generate an electrostatic force. The dielectric has a contact surface that is characterized by an average surface roughness of less than about 0.5 µm, a surface peak waviness of less than about 0.12 µm, and a surface peak waviness material ratio of greater than about 20%. The dielectric is mounted on a pedestal.

In one method of fabricating the electrostatic chuck, a green ceramic preform having an embedded electrode is formed, and sintered to form a sintered electrostatic chuck having a contact surface. The contact surface is lapped to provide a surface roughness of less than about 0.5 µm, a surface peak waviness of less than about 0.12 µm, and a surface waviness material ratio of greater than about 20%.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
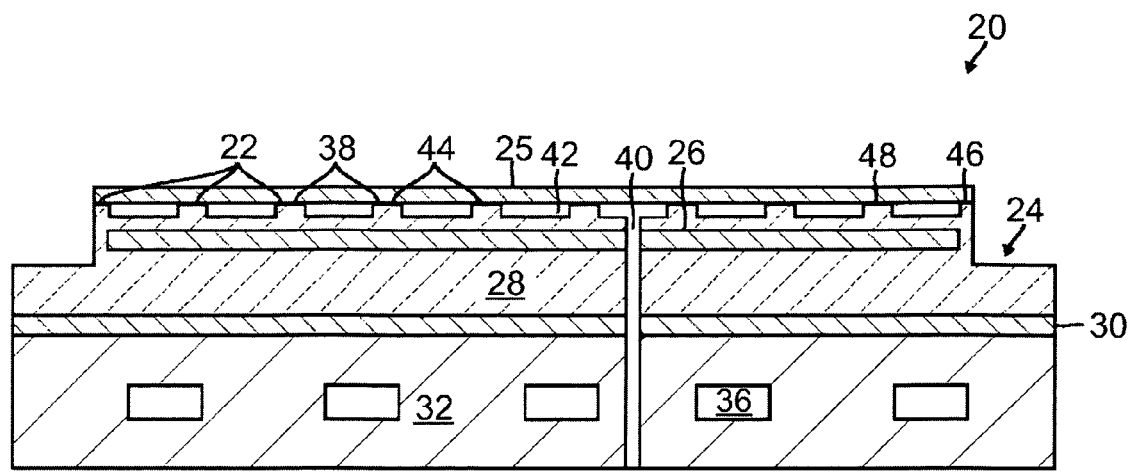
FIG. 1 is a partial sectional side view of an embodiment of a substrate support comprising an electrostatic chuck having a contact surface comprising mesas.
Figure 5:
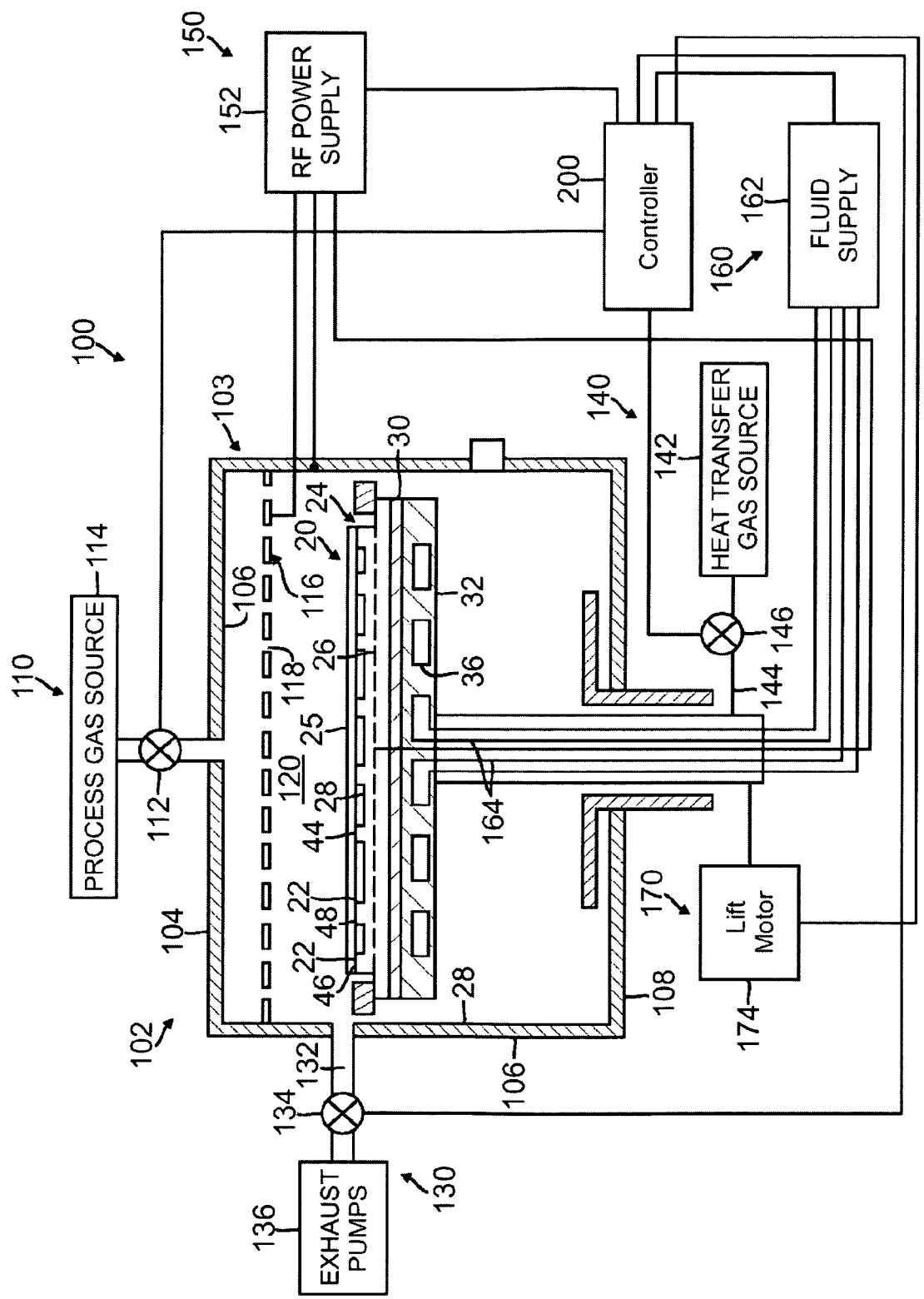
FIG. 5 is a schematic side view of an embodiment of a substrate processing apparatus comprising a process chamber with an electrostatic chuck.

An exemplary embodiment of a substrate support 20 comprises a contact surface 22 on an electrostatic chuck 24, as shown in FIG. 1, and is used to support a substrate 25 in a process chamber 102 (FIG. 5). The support 20 comprises an electrostatic chuck 24 having an electrode 26 capable of receiving an electrical charge to generate an electrostatic force to hold the substrate 25 against the contact surface 22. The electrode 26 may also be capable of being electrically biased to with a high frequency current to energize a process gas in a process chamber 102 of a substrate processing apparatus 100 for example to form a plasma. The embedded electrode 26 can comprise, for example, a mesh electrode made of a suitable metal material, such as aluminum, copper, molybdenum or tungsten. In one version, the electrostatic chuck 24 comprises a dielectric 28 having the contact surface 22 thereon, that at least partially covers the electrode 26, or as shown, has the electrode 26 embedded therein. The dielectric 28 is shaped and sized to provide the desired electrical characteristics of the chuck 24 and good erosion resistance in the process chamber 102. Suitable materials for the dielectric 28 can comprise, for example, ceramic materials such as at least one of aluminum nitride or aluminum oxide. In one version the electrostatic chuck 24 comprises a dielectric 28 of aluminum nitride with an embedded electrode 26 of molybdenum. As another example, the dielectric 28 can comprise aluminum oxide surrounding a tungsten electrode. While an exemplary version of a support 20 comprising an electrostatic chuck 24 is shown and described herein, it should be understood that the support 20 and chuck 24 can have other different forms, as would be apparent to those of ordinary skill in the art.

The electrostatic chuck 24 further comprises a pedestal 32 which is heat bonded with a bond layer 30 to the dielectric 28. For example, the bond layer 30 can be a silicon-based adhesive sheet, such as Chomerics of Parker Hannifin Corp, Woburn Mass. The bond layer 30 can also be a ceramic layer, for example, porous silicon carbide infiltrated with aluminum, or a brazed bond layer of brazing material such as a nickel-based alloy. The pedestal 32 is typically made from a metal such as aluminum or stainless steel. It can be machined as a single piece or multiple pieces. In one version, the pedestal 32 comprises a plate with fluid channels 36 machined into the plate. The fluid channels 36 serves as a heat exchanger which can be used to regulate the temperatures of the substrate 25, for example, by circulating cooling fluid or heating fluid through the channels 36.

The chuck 24 can also have heat transfer gas outlets 40, which deliver heat transfer gas to the contact surface 22 to control a temperature of a substrate 25 on the surface 22. The heat transfer gas outlets 40 deliver the gas-to-gas grooves 42 in the surface 22. For example, the chuck 24 can comprise a plurality of raised mesas 44 having the contact surface 22 thereon, with gas grooves 42 therebetween. The heat transfer gas is typically a non-reactive gas, such as helium or argon.

The contact surface 22 of the electrostatic chuck 24 contacts a substrate 25 placed on the chuck 24. The contact surface 22 can be a substantially flat region in contact with substantially the entire backside surface of the substrate 25. In one version, the contact surface 22 is on the top 38 of the mesas 44 or other raised features on the surface of the chuck 24. The mesas 44 are provided to elevate the backside surface of the substrate 25 so that almost the entire backside surface is exposed to the heat transfer gas provided via the gas grooves 42. The contact surface 22 has selected surface characteristics that provide and maintain good thermal contact between the surface 22 and substrate 25 and to reduce leakage of heat transfer gas from the edges of the chuck 24. In one version, the mesas 44 include two seal bands 46, 48, which extend along the entire periphery of the chuck 25. The region between the seal bands 46, 48 allow a different pressure of heat transfer gas to regulate the temperature of this region below the substrate 25 in relation to the central region that lies within the circumference of the first seal band 48.

The surface texture properties of the contact surface 22 include surface roughness and surface waviness. The surface texture properties can arise from machining process marks produced by the action of a cutting tool or machining process of the surface of a chuck. The surface texture is also a product of the grain structure or grain size of the grains on the surface. The surface texture properties were also found to change with plasma exposure time, because the plasma in the chamber eroded or otherwise degraded the contact surface exposed to the plasma during processing of a substrate. The level and type of surface degradation resulted in the deterioration of the properties of the contact surface; such as heat transfer gas leak rate reduction, thermal transfer rates, or other such properties.

Figure 2:
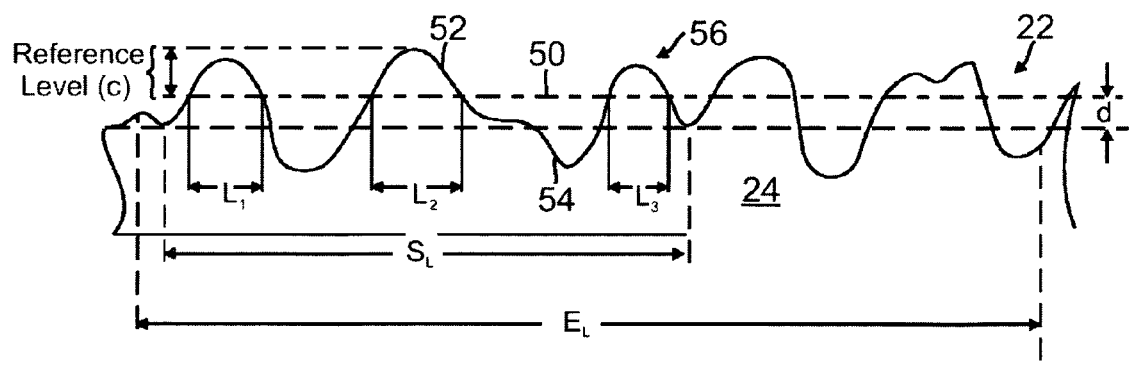
FIG. 2 is a schematic diagram of an exemplary surface profile trace of a contact surface showing the surface texture measurements made from a sample length of an evaluation length.
Figure 3:
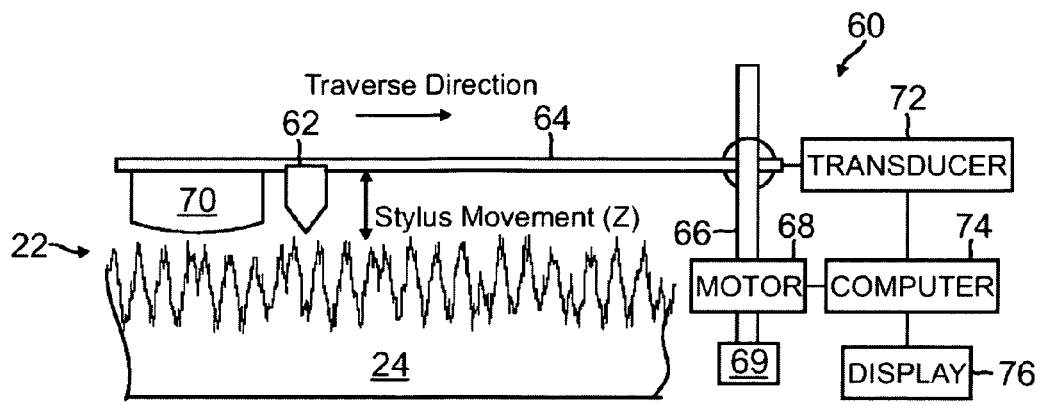
FIG. 3 is a schematic diagram of a surface profiler used to measure the surface profile of the contact surface.

One important surface texture property is the average surface roughness (Ra) which is the mean of the absolute values of the displacements from a mean line 50 of the protrusions 52 and depressions 54 of the features 56 along the contact surface 22, as shown in FIG. 2. In measuring the average surface roughness, the international standard ANSI/ASME B.46.1—1995 specifying appropriate cut-off lengths and evaluation lengths, can be used. It was determined that preferably, the average surface roughness of the contact surface 22 should be less than about 0.6 μm, or even less than about 0.5 μm. The low surface roughness provides good heat transfer gas sealing capabilities at the seal bands 46, 48 at the outer periphery of the chuck 24. Excessive leakage of heat transfer gas occurs from the seal band regions 46, 48 when the surface roughness is too high. Also, excessive surface roughness on the tops 38 of the mesas 44, it can result in non-uniform temperatures because the top surface of some of the mesas 44 directly contact a larger portion or area of the backside surface of the substrate 25 whereas other mesas only contact smaller backside areas resulting in higher temperatures on those overlying substrate portions.

It was discovered that another important surface texture property is the surface waviness of the contact surface 22. Surface waviness is generally on a larger scale than roughness and is usually produced by the instabilities in the machining process used to form the contact surface 22. Surface waviness has a longer wavelength than surface roughness, the later being superimposed on the waviness. It was also discovered that surface waviness changes with the plasma exposure time that the chuck 24 sees in the chamber 102 because of the higher erosion rates of surface regions that are partially exposed to the plasma relative to regions not exposed to the plasma. For example, when the plasma accesses a portion of the contact surface, for example, an edge of the chuck that which has a small gap with the overlying substrate, it preferential erodes that portion relative to other chuck surface portions, which are not exposed to the plasma or at least more tightly, sealed against plasma penetration. The change in surface waviness was found to be a primary contributor to the degradation of the contact surface properties, such as higher heat transfer gas leakage and lower thermal transfer rates at regions of the chuck which change in surface waviness One type of surface waviness measurement, namely surface peak waviness Wp, is the mean amplitude of the measured surface profile after the small wavelength roughness variations have been filtered out at a cutoff length. Surface peak waviness is a measure of the amplitude of relatively gradual (low frequency) peaks. Sampling is done by segmenting the data of a signal trace of the surface profile into equal lengths, each of which have the same numeral value, to provide a better statistical evaluation of the data. Thus, using a cut-off value of 0.8 mm, which was used in the present case, means that the filtered data is segmented into sample lengths of 0.8 mm. Usually five or more sample lengths are taken. Preferably, it was determined that the surface peak waviness at a cut-off length of 0.8 mm is less than about 0.12 µm.

Yet another surface property, the surface waviness material ratio (Wmr(c)), also was found to affect surface leakage rates and thermal properties after use of the chuck in the chamber. The surface waviness material ratio is the waviness of a length of the contact surface, $L_1$, $L_2$, $L_3$ etc., expressed as a percentage of the evaluation length L at a depth (d) below a reference depth level (c) that cuts below the contact surface, as shown in FIG. 2. In this figure, the length $E_L$ is the total evaluation length of the surface profile and $S_L$ is the sample length of data selected from the evaluation length. The reference depth level (c) can be set from various levels such as the mean line, the lowest valley, the highest peak or even from a material ratio level. Thus, the surface waviness material ratio Wmr(0.2) is the fraction of a line drawn through the profile 0.2 µm below the peak that cuts through the material at a depth below the contact surface, namely the lengths $L_1$, $L_2$ and $L_3$. Preferably, the surface waviness material ratio Wmr(0.2) was determined to be at least about 20%.

It has been discovered that contact surface regions 31 of a contact surface 22 having fairly high protrusions 52 that cross such an imaginary line, even if they are relatively sparsely distributed on the surface 22, can widen the gap distance between the contact surface 22 and substrate 25. The wider spacing can allow heat transfer gas to escape from beneath the substrate 25 and result in inconsistent temperature control, and undesirable processing results. Surfaces having fairly deep depressions 54 that cross a lower imaginary line, even for just a few of the deep depressions, may have depressions that are sufficiently deep to serve as conduits for the leakage of heat transfer gas from between the substrate 25 and support surface 22, and which can similarly result in reduced control over processing temperatures and inconsistent substrate processing results. The deep depressions 54 can be the result of excessive surface scratching during polishing steps, such as during a diamond grinding or polishing step, or can result from erosion in the plasma chamber environment. Thus, it has been discovered that it is desirable to have a substantially flat contact surface 22 having features 56 that are not excessively high or deep, and that do not exceed the flatness criterion.

Figure 4:
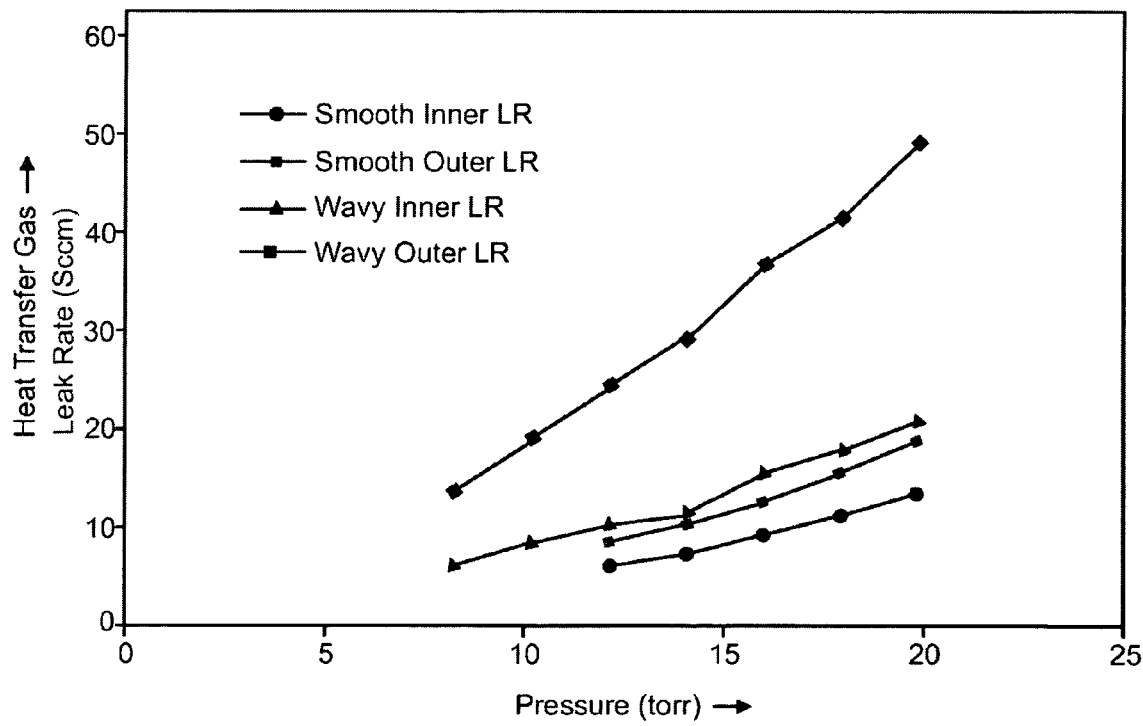
FIG. 4 is a graph of the helium leak rate measure for chucks having good (smooth) and bad (wavy) surface waviness measurements.

That the surface peak waviness and waviness material ratio of the contact surface 22 could so strongly affect the temperature control and processing uniformity of the electrostatic chuck 24 came as an unexpected surprise. Standard measurement techniques, such as conventional average surface roughness techniques using profilometers, typically do not reveal the presence of the surface waviness. In conventional chucks, surface roughness was typically used as standardized measurement methods used to characterize the contact surface 22. However, surface roughness measurements, by themselves, were insufficient because chucks 24 having similar surface roughness measurements were found to have entirely different performances, especially in the processing of a batch of substrates. The surface waviness values are not determined from average surface roughness measurements because the surface waviness variations are on a larger scale than the roughness measurements. It is not known to use surface waviness measurements of the contact surface 22. Accordingly, the cause of heat transfer gas leakage during processing and non-uniform processing results was not well understood. Furthermore, as the polished contact surface 22 were believed to be relatively smooth, it was not expected that the overall waviness of the surface would play such a large role in the control of processing temperatures, and thus processing uniformity, for electrostatic chucks 24. It has been discovered that surface waviness is the reason for the observed discrepancies in chuck performance. As shown by the data of Table I and FIG. 4, two chucks 24 having similar surface roughness and flatness values have different performances if the surface waviness values of the chucks are different. Specifically, the chuck 24 with greater waviness was found to have much higher heat transfer gas leakage and also allowed de-chucking of the substrate only at a higher voltage.

TABLE I

|  | Smooth Chuck | Wavy Chuck |
| --- | --- | --- |
| Ra (µm) | 0.37 | 0.41 |
| Wp (µm) | 0.11 | 0.28 |
| Wmr (.2) (%) | 17 | 9 |
| Dechucking Voltage (V) (@ 20 Torr) | 400 | 500 |

The good electrostatic chuck 24 with the contact surface 22 that provided less helium gas leakage had an Ra of 0.37 µm, a Wp of 0.11 µm, and a Wmr(0.2) of 17%. The undesirable chuck 24 had a higher Ra of 0.41 µm and a much higher Wp by a factor of two of 0.11 µm. Also, the surface waviness material ratio Wmr(0.2) decreased from 17% in the good chuck to 9% for the bad chuck which indicates a problem. The chucking voltage for the good chuck with the lower surface waviness was about 400 and for the poor performing chuck with the higher waviness was also higher 25% higher at 500 Volts. The helium leakage rate on a good chuck is less than half of that on bad chuck. In this example, the heat transfer gas leak rate is performed by placing a substrate 25 is placed on the contact surface 22 of the electrostatic chuck 24 and applying an electrical power to the electrode 26 of the chuck 24 to electrostatically attract the substrate 25 against the contact surface 22. Heat transfer gas, such as helium argon, is provided to the contact surface 22 via the heat transfer gas delivery system, for example, helium gas can be provided at a pressure of 20 Torr. The rate at which the heat transfer gas leaks out from between the substrate 25 and surface 22 is measured, for example by a mass flow controller.

In another example, helium leakage rate was measured for a chuck 24 at about 3 sccm before processing any substrates 25, and at about 5 sccm after the processing of a number of substrates. The higher leakage rate resulted from degradation of the chuck 24 with small areas of material erosion of the contact surface 22, and would conventionally require replacement of the chuck. Initially, over most of the contact surface 22, the roughness average Ra did not change much, limited to about 0.5 µm. However, after processing a number of substrates, the roughness (Ra) increased from 0.5 to 0.8 µm in the eroded areas, which is still considered acceptable, and thus would not require replacement of the chuck 24. However, the surface peak waviness (Wp) increased from 0.08 to 0.45 mm and the surface waviness material ratio (Wmr) at a depth of 0.2 µm decreased from 18% to 7%. Thus the surface peak waviness and the waviness material ratio both clearly indicated that the chuck 24 should be replaced or refurbished. The waviness measurements indicated that the contact surface 22 had degraded. The chuck 24 was then removed for reworking the contact surface 22 to acceptable levels to reduce the surface waviness and waviness material ratios to acceptable levels of Wp of less than about 0.12 mm and Wmr(0.2) of at least about 20%. When this was done, the chuck 24 regained its low helium leakage rate of less than about 3 sccm.

The contact surface 22 of the chuck 24 can be re-polished to the desired surface waviness, waviness material ratio, and average surface roughness values by a lapping method. The lapping process removes the undesirable surface waviness of the chuck 24 caused by uneven plasma erosion, and reduces variations in level of features comprising protrusions 52 and depressions 54 in the contact surface 22. The lapping process can be performed before or after any other polishing or grinding processes, or it may be used as the sole polishing technique. In one version, the lapping process is performed after an initial diamond grinding process that rough grinds the surface 22 to provide a surface having the desired average surface roughness. For example, a diamond coated spindle can be is rotated against the contact surface 22 to polish the contact surface 22.

In the lapping method, the chuck 24 is held in a rigid fixture so that the contact surface 22 is pressed and rotated against a hard flat surface. The rigid fixture is any conventional mechanical mounting system mounted on a stable base to minimize vibration, chattering and misalignment. The hard flat surface can be a surface of a platter made from granite. Both the chuck 24 and the platter are pressed against each other and rotated while a slurry of abrasive particles is introduced between the two surfaces. The surface lapping flatness is controlled by the grain size of the abrasive particles. The abrasive particles can be particles of aluminum oxide, silicon carbide or even diamond particles. Preferably, a slurry of abrasive particles comprising silicon carbide particles is suspended in a medium such as water.

In the above examples, the surface texture measurements were made using a surface profiler 60. A suitable surface profiler 60 comprises a stylus 62 mounted on a surface-traversing arm 64 which is connected to a column 66 and driven by a motor 68. The stylus 62 can be interchangeable with different versions available for different surface properties or measurements. The column 66 is mounted on a stable base 69, such as a heavy metal or granite platform. A skid 70 can be used to traverse on the surface to maintain the straightness of the stylus 62 and provide a support for the traversing stylus 62. The surface properties of the contact surface 22 are measured by dragging the stylus 62 across an evaluation length $E_L$ of the contact surface 22. As the stylus 62 moves up and down along the contact surface 22 it generates a surface profile signal, which is passed to a transducer 72 such as an inductive transducer to convert the vibrations of the stylus into a signal. The transducer signal is then processed by a computer 74 with conventional user interfaces and control systems, to a selected sample length $S_L$ and other parameters to determine surface texture numbers and a visual surface profile trace, as shown in FIG. 2, and shown in a display 76. A suitable surface profiler 60 can be a stylus profiler such as the Form Talysurf Model 120 stylus profiler, from Taylor Hobson, Leicester, England.

The stylus 62 passes over the contact surface 22 in a straight line such that only the stylus tip follows the surface 22 under test using a straightness maintaining skid 70. In the current examples, the stylus profiler 60 measured surface texture by running the stylus 62 across a traverse length of maximum about 120 mm across the contact surface 22 of the seal bands 46, 48 of the chuck 24. The stylus 62 generated two parallel lines spaced apart about 1 micron over the entire traverse length. The stylus 62 has a range of about 6 mm, and the column 66 on which the stylus 62 was mounted could traverse about 450 mm. The skid 70 was a part of the stylus assembly and had a radius sufficiently large to skid over the top of the protrusions 52 on the contact surface 22 without sliding in and out of the protrusions 52. The stylus 62 and the skid 70 are usually independent in their height (Z) movement but move together in the measurement direction. Surface deviations are recorded as the difference between the movement in the Z direction of the stylus 62 and skid 70.

The profile signal from the stylus 62 and transducer 72 is processed to separate surface roughness, from surface waviness, and surface form. The separation is done with filtering using cut-off values, for example, by selecting either a roughness or waviness filtering cut-off value. For example, to measure the surface waviness, the waviness filter cut-off is selected to remove profile measurements caused by roughness elements, leaving the waviness profile for evaluation, and vice versa. The filters are electronic or mathematical methods or algorithms, which separate out different wavelengths to restrict the data to a selected range of wavelengths. The filters can be analogue electronic filters, which have two capacitors and two resistors, and are commonly known as 2CR filters. Another filter, called the 2CR PC filter, is a phase corrected filter, which has less distortion than the 2CR filter. Gaussian filters, are preferred because they are phase correct filters with reduced filter distortion. However, gaussian filters can only be implemented where filtering is done by mathematical algorithms on computer systems. The cut-off is a numerical value below or above which the filter reduces or removes unwanted wavelengths. For example, waviness filter cut-off value of 0.8 mm allows wavelengths above 0.8 mm to pass through the filter, while wavelengths below 0.8 mm are reduced in amplitude or entirely eliminated. After the stylus profile data has been filtered with a filter and cut-off value, it is sampled by segmenting the data into equal sample lengths, which have the same numerical value as the cut-off value to allow statistical analysis. Thus, a 0.8 mm cut-off value will cause the filtered data to be broken down into 0.8 mm sample lengths for analysis.

While one method of measuring surface waviness is described, it should be understood that the present invention should not be limited to the described method, and the surface waviness can be measured by other methods as would be apparent to those of ordinary skill in the art. For example, the surface profile can be measured by a non-contact method in which the surface profile is determined substantially without mechanically touching the contact surface 22. For example, the surface profile can be measured by a laser scanning interferometric system capable of detecting a property of the laser beam reflected from the contact surface 22 at different points across the surface, such as an intensity of a wavelength of radiation. In one version, laser beam is raster scanned across the contact surface 22, and an interferometer is used to detect the height/depth of the surface profile from the constructive or destructive interference of the reflected beam as it traverses across the surface 22. In another version, a property of a sound wave reflected from the surface 22 may be detected to determine the surface profile.

An embodiment of an apparatus 100 comprising a process chamber 102 suitable for processing a substrate 25, which can use the chuck 24, is shown in FIG. 5. The particular embodiment of the apparatus 100 shown herein is suitable for processing substrates 25, such as semiconductor wafers, and may be adapted by those of ordinary skill to process other substrates 25, such as flat panel displays, polymer panels, or other electrical circuit receiving structures. The apparatus 100 is particularly useful for processing layers, such as etch resistant, silicon-containing, metal-containing, dielectric, and/or conductor layers on the substrate 25. The apparatus 100 may also be attached to a mainframe unit (not shown) that contains and provides electrical, plumbing, and other support functions for the apparatus 100 and may be part of a multichamber system (not shown). In one version, the chamber 102 comprises an etch chamber 102 capable of etching features on a substrate 25. For etch chamber is the eMAX™ chamber from Applied Materials, Santa Clara, Calif.

Generally, the process chamber 102 comprises a wall, such as an enclosure 103, which may comprise a ceiling 104, sidewalls 106, and a bottom wall 108 that enclose a process zone 108. In operation, process gas is introduced into the chamber 102 through a gas supply 110 that includes a valve 112 and one or more process gas sources 114, and a gas distributor 116. The gas distributor 116 may comprise may be a showerhead having gas outlets 118 to introduce process gas into the process zone 120. Alternatively, the gas supply 110 can comprise gas outlets around a periphery of the substrate 25 (not shown). The substrate is held in the process zone 120 on a contact surface 22 of an electrostatic chuck 24, which is part of the support 20. Spent process gas and process byproducts are exhausted from the chamber 102 through an exhaust 130 which may include an exhaust conduit 132 that receives spent process gas from the process zone 120, a throttle valve 134 to control the pressure of process gas in the chamber 102, and one or more exhaust pumps 136.

The heat transfer gas outlets 40 are a part of a heat transfer gas delivery system 140 adapted to supply the heat transfer gas to the surface 22. The gas delivery system 140 can further comprise a heat transfer gas source 142 connected by one or more heat transfer gas tubes 144 to the gas outlets 40 on the surface 22 of the chuck 24. The gas delivery system 140 may further comprise one or more flow valves 146 to control a flow rate of the heat transfer gas to the contact surface 22. A suitable heat transfer gas desirably comprises an inert gas, such as helium or argon.

The process gas may be energized to process the substrate 25 by a gas energizer 150 that couples energy to the process gas in the process zone 120 of the chamber 102. In the version shown in FIG. 5, the gas energizer 150 comprises the process electrodes 26, 27, which are powered by a power supply 152 to energize the process gas. The process electrodes 26, 27 may include an electrode 27 that is the sidewall 106 or ceiling 104 of the chamber 102 that may be capacitively coupled to the electrode 26 in the support 20 below the substrate 25. Alternatively or additionally, the gas energizer 150 may comprise an antenna (not shown) comprising one or more inductor coils which may are symmetric about the center of the chamber 102. In yet another version, the gas energizer 150 may comprise a microwave source and waveguide to activate the process gas by microwave energy in a remote zone (not shown) upstream from the chamber 102. The chamber 102 can furthermore comprise a magnetic field generator (not shown) capable of generating a magnetic field in the process zone 120, to improve processing with the energized gas. The magnetic field generator comprises electromagnetic coils or magnets about the process zone 120, and may also be capable of rotating the magnetic field in the chamber 102.

The chamber 102 further comprises a heat exchanging system 160 to control temperatures in the chamber, such as a temperature of the substrate 25 on the support 20. In one version, the heat exchanging system 160 comprises a fluid supply 162 to supply heated or cooled fluid to a tube 164, which extends to the channels 36 of the pedestal 32 to allow the fluid to circulate in the channels 36.

To process a substrate 25, the process chamber 102 is evacuated and maintained at a predetermined sub-atmospheric pressure. The substrate 25 is then provided on the support 20 by a substrate transport 170, such as for example a robot arm and a lift pin system operated by the lift motor 174. The gas supply 130 provides a process gas to the chamber 102 and the gas energizer 150 couples RF or microwave energy to the process gas to energize the gas to process the substrate 25.

The chamber 102 is controlled by a controller 200 that comprises program code having instruction sets to operate components of the chamber 102 to process substrates 25 in the chamber 102. For example, the controller 200 can comprise a substrate positioning instruction set to operate one or more of the substrate support 22 and substrate transport 170 to position a substrate 25 in the chamber 102; a gas flow control instruction set to operate the valves 112 to set a flow of process gas to the chamber 102; a gas pressure control instruction set to operate the exhaust throttle valve 134 to maintain a pressure in the chamber 102; a gas energizer control instruction set to operate the gas energizer 150 to set a gas energizing power level; a temperature control instruction set to operate the heat exchanging system 162 and the heat transfer gas delivery system 140 to control the temperatures of the substrate 25 in the chamber 102; and a process monitoring instruction set to monitor the process in the chamber 102.

The present invention has been described with reference to certain preferred versions thereof; however, other versions are possible. For example, the contact surface 22 with the controlled surface waviness can be used in other types of applications, as would be apparent to one of ordinary skill. Other configurations of the electrostatic chuck 24 can also be used. Further, alternative methods for determining surface waviness or for lapping the contact surface, can also be used in accordance with the parameters of the described implementation, as would be apparent to one of ordinary skill. Therefore, the spirit and scope of the appended claims should not be limited to the description of the preferred versions contained herein.

What is claimed is:

1. An electrostatic chuck for holding a substrate in a process chamber, the electrostatic chuck comprising:
    (a) at least one electrode capable of receiving an electrical charge to generate an electrostatic force;
    (b) a dielectric enclosing the electrode, the dielectric having a contact surface that is characterized by:
        (i) an average surface roughness of less than about 0.6 µm,
        (ii) a surface peak waviness across the entire contact surface of less than about 0.12 µm, and
        (iii) a surface waviness material ratio of greater than about 20%, the surface waviness material ratio being measured at a reference depth level; and
    (c) a pedestal bonded to the dielectric.

2. A chuck according to claim 1 wherein the surface peak waviness is the mean amplitude of the measured surface profile after the small wavelength roughness variations have been filtered out at a cutoff length.

3. A chuck according to claim 2 wherein the cutoff length for the surface peak waviness is 0.8 mm.

4. A chuck according to claim 1 wherein the surface waviness material ratio is the waviness of a length L of the contact surface expressed as a percentage of the evaluation length $E_L$ at a depth (d) below a reference depth level (c) which cuts 0.2 microns below the contact surface.

5. A chuck according to claim 1 wherein the dielectric comprises a contact surface such that when a batch of 1000 substrates are processed on the electrostatic chuck in a process chamber having a plasma environment, the change in temperature from the first processed substrate to the $1000^{th}$ processed substrate is less than about 10° C.

6. A chuck according to claim 5 wherein the change in heat transfer gas leak rate from the first processed substrate to the $1000^{th}$ processed substrate is less than 2 sccm.

7. A chuck according to claim 1 wherein the dielectric comprises aluminum nitride or aluminum oxide.

8. A chuck according to claim 1 wherein the contact surface comprises a plurality of mesas, the mesas including at least one seal band.

9. A chuck according to claim 1 wherein the pedestal comprises fluid channels.

10. An electrostatic chuck for holding a substrate in a process chamber, the electrostatic chuck comprising:
  (a) at least one electrode capable of receiving an electrical charge to generate an electrostatic force;
  (b) a dielectric enclosing the electrode, the dielectric having a contact surface defined by the tops of a plurality of mesas, and wherein the contact surface is characterized by:
    (i) an average surface roughness of less than about 0.6 µm,
    (ii) a surface peak waviness across the entire contact surface of less than about 0.12 µm, the surface peak waviness being the mean amplitude of the measured surface profile after the small wavelength roughness variations are filtered out at a cutoff length of 0.8 mm; and
    (iii) a surface waviness material ratio of greater than about 20% the surface waviness material ratio being the waviness of a length L of the contact surface expressed as a percentage of the evaluation length $E_L$ at a depth (d) below a reference depth level (c) which cuts 0.2 microns below the contact surface; and
  (c) a pedestal bonded to the dielectric with a bond layer, the pedestal comprising fluid channels.

11. A chuck according to claim 10 wherein the dielectric comprises a contact surface such that when a batch of 1000 substrates are processed on the electrostatic chuck in a process chamber having a plasma environment, the change in temperature from the first processed substrate to the $1000^{th}$ processed substrate is less than about 10° C.

12. A chuck according to claim 11 wherein the change in heat transfer gas leak rate from the first processed substrate to the $1000^{th}$ processed substrate is less than 2 sccm.

13. A chuck according to claim 10 wherein the dielectric comprises aluminum nitride or aluminum oxide.

14. A chuck according to claim 10 wherein the bond layer comprises an adhesive sheet.

15. A method of fabricating an electrostatic chuck comprising a dielectric with an embedded electrode, the method comprising:
  (a) forming a green ceramic preform comprising a least one embedded electrode;
  (b) sintering the green ceramic preform to form a sintered electrostatic chuck having a contact surface;
  (c) lapping the contact surface to provide a surface roughness of less than about 0.6 µm, a surface peak waviness of less than about 0.12 µm across the entire contact surface, and a surface waviness material ratio of greater than about 20%, the surface waviness material ratio being measured at a reference depth level.

16. A method according to claim 15 wherein (c) comprises lapping the contact surface with a slurry comprising abrasive particles.

17. A method according to claim 16 comprising lapping the contact surface with a slurry comprising abrasive particles of silicon carbide particles.

18. A method according to claim 15 comprising bonding a pedestal to the sintered electrostatic chuck.

19. A method according to claim 18 comprising forming a pedestal having fluid channels.

20. An electrostatic chuck fabricated by the process of claim 15.

* * * * *